United States Patent
Thomas et al.

(10) Patent No.: US 11,217,760 B2
(45) Date of Patent: Jan. 4, 2022

(54) IN-SITU GROWTH OF QUANTUM DOTS AND NANO-CRYSTALS FROM ONE, TWO, OR THREE DIMENSIONAL MATERIAL

(71) Applicant: University of Central Florida Research Foundation, Inc., Orlando, FL (US)

(72) Inventors: Jayan Thomas, Orlando, FL (US); Basudev Pradhan, Kolkata (IN); Farzana Chowdhury, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 16/901,245

(22) Filed: Jun. 15, 2020

(65) Prior Publication Data

US 2021/0005831 A1 Jan. 7, 2021

Related U.S. Application Data

(60) Provisional application No. 62/923,074, filed on Oct. 18, 2019, provisional application No. 62/869,453, filed on Jul. 1, 2019.

(51) Int. Cl.
*H01L 51/42* (2006.01)
*H01L 51/00* (2006.01)

(52) U.S. Cl.
CPC ...... *H01L 51/4213* (2013.01); *H01L 51/0007* (2013.01); *H01L 51/428* (2013.01)

(58) Field of Classification Search
CPC ............. H01L 51/4213; H01L 51/0007; H01L 51/428
See application file for complete search history.

(56) References Cited

U.S. PATENT DOCUMENTS

| | | | |
|---|---|---|---|
| 2013/0032782 A1* | 2/2013 | Gerasimos | ............ H01L 31/028 257/21 |
| 2016/0380136 A1* | 12/2016 | Ning | ................... H01L 31/0368 252/519.4 |
| 2018/0374700 A1* | 12/2018 | Marino | ............. H01L 21/02628 |

OTHER PUBLICATIONS

Pradhan et al., "Ultrasensitive and ultrathin phototransistors and photonic synapses using perovskite quantum dots grown from graphene lattice", Science Advances 6, Feb. 12, 2020, pp. 1 through 11, AAAS.

Optoelectronics, "Defects in graphene help perovskite dots grow", Science Advances 6, Mar. 20, 2020, p. 1, AAAS.

Shao et al., "Stable Graphene-Two-Dimensional Multiphase Perovskite Heterostructure Phototransistors with High Gain", Nano Letters 17, Nov. 7, 2017, pp. 7330 through 7338, ACS Publications, American Chemical Society.

Su et al., "Visualizing graphene edges using tip-enhanced Raman spectroscopy", Journal of Vacuum Science & Technology B 31, 041808, Jul. 23, 2013, AVS; Science & Technology of Materials, Interfaces, and Processing.

(Continued)

*Primary Examiner* — Quoc D Hoang
(74) *Attorney, Agent, or Firm* — Fogg & Powers LLC

(57) ABSTRACT

Techniques for growing, at least one of: (a) quantum dots and (b) nano-crystals, on a surface of a material are provided. One method comprises placing a precursor on the surface; adding an antisolvent to the precursor; and growing at least one of the quantum dots and the nanocrystals on the surface.

11 Claims, 2 Drawing Sheets

(56) References Cited

OTHER PUBLICATIONS

Figure 1A:
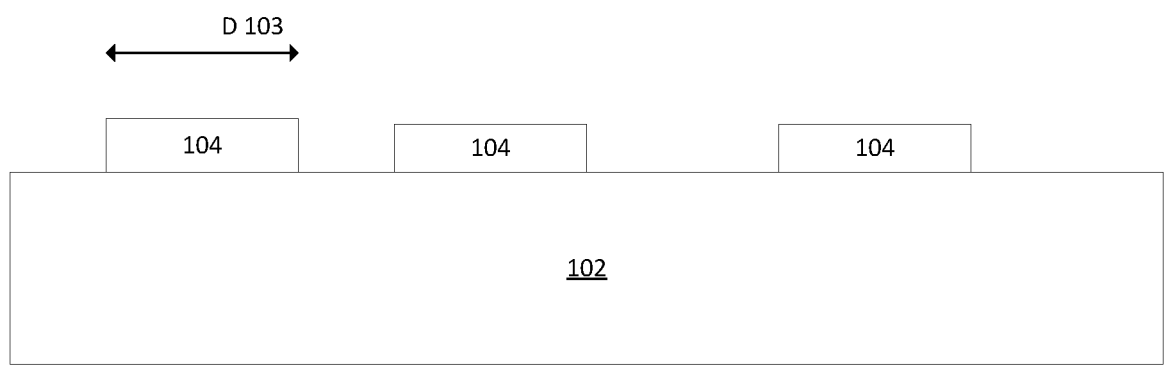

Tanaka et al., "Comparative study on the excitons in lead-halide-based perovskite-type crystals Ch3NH3PbBr3 CH3NH3PbI3", Solid State Communications 127, 2003, pp. 619 through 623, Elsevier Ltd.

Tang et al., "A Colloidal-Quantum-Dot Infrared Photodiode with High Photoconductive Gain", Small 14, 1803158, 2018, Advanced Science News, Wiley-VCH Verlag GmbH & Co.

Varadwaj et al., "Why Do Eight Units of Methylammonium Enclose PbI64-Octahedron in Large-Scale Crystals of Methylammonium Lead Iodide Perovskite Solar Cell? An Answer from First-Principles Study", arXiv preprint arXiv:1704.05691 (2017), pp. 1 through 8.

Wang et al., "Hybrid Graphene-Perovskite Phototransistors with Ultrahigh Responsivity and Gain", Advanced Optical Materials 3, 2015, pp. 1389 through 1396, Materials Views, Wiley-VCH Verlag GmbH & Co., wileyonlinelibrary.com.

Wang et al., "Structural and Photophysical Properties of Methylammonium Lead Tribromide (MAPbBr3) Single Crystals", Scientific Reports, Oct. 20, 2017, pp. 1 through 14, www.nature.com/scientificreports.

Wang et al., "Ultrasensitive and Broadband MoS2 Photodetector Driven by Ferroelectrics", Advanced Materials 27, 2015, pp. 6575 through 6581, Materials Views, Wiley-VCH Verlag GmbH & Co., wileyonlinelibrary.com.

Weidman et al., "Colloidal Halide Perovskite Nanoplatelets: An Exciting New Class of Semiconductor Nanomaterials", Chemistry of Materials 29, May 9, 2017, pp. 5019 through 5030, ACS Publications, American Chemical Society.

Weidman et al., "Monodisperse, Air-Stable PbS Nanocrystals via Precursor Stoichiometry Control", ACSNano, 2014, pp. 6363 through 6371, vol. 8, No. 6, www.acsnano.org.

Woo et al., "Temperature-Dependent Photoluminescence of CH3NH3PbBr3 Perovskite Quantum Dots and Bulk Counterparts", The Journal of Physical Chemistry Letters 9, Jul. 5, 2018, pp. 4066 through 4074, ACS Publications, American Chemical Society.

Xia et al., "Ultrafast graphene photodetector", Nature Nanotechnology, Dec. 2019, pp. 839 through 843, vol. 4, www.nature.com/naturenanotechnology.

Xing et al., "High-Efficiency Light-Emitting Diodes of Organometal Halide Perovskite Amorphous Nanoparticles", ACS Nano 10, Jun. 10, 2016, pp. 6623 through 6630, ACS Publications, American Chemical Society.

Xu et al., "A CsPbBr3 Perovskite Quantum Dot/Graphene Oxide Composite for Photocatalytic Co2 Reduction", Journal of the American Chemical Society 139, Apr. 6, 2017, pp. 5660 through 5663, ACS Publications, American Chemical Society.

Yong et al., "Low-Dimensional Nanomaterials Based on Small Organic Molecules: Preparation and Optoelectronic Properties", Advanced Materials 9999, 2008, pp. 1 through 18, Wiley-VCH Verlag GmbH & Co.

Zhang et al., "Brightly Luminescent and Color-Tunable Colloidal CH3NH3PbX3 (X=Br, I, CI_ Quantum Dots: Potential Alternatives for Display Technology", ACS Nano, 2015, pp. 4533 through 4542, vol. 9, No. 4, www.acsnano.org.

Zhang et al., "Broadband high photoresponse from pure monolayer graphene photodetector", Nature Communications 4:1811, May 7, 2013, pp. 1 through 11, Macmillan Publishers Limited.

Zhang et al., "Enhanced nonlinear optical properties of graphene-oligothiophene hybrid material", Optics Express 23959, Dec. 21, 2009, pp. 1 through 6, vol. 17, No. 26, OSA.

Zheng et al., "Ambipolar Graphene-Quantum Dot Phototransistors with CMOS Compatibility", Advanced Optical Materials 6, 1800985, 2018, pp. 1 through 8, Wiley-VCH Verlag GmbH & Co.

Zhou et al., "Synthesis of Halide Perovskite Quantum Dots for Display Applications", Material Matters 13.1, 2018, pp. 1 through 8, https://www.sigmaaldrich.com/technical-documents/articles/material-matters/synthesis-halide-perovskite-quantum-dots-display-applications.html.

Zhu et al., "Efficiency Enhancement of Perovskite Solar Cells through Fast Electron Extraction: The Role of Graphene Quantum Dots", Journal of the American Chemical Society 136, Feb. 24, 2014, pp. 3760 through 3763, ACS Publications, American Chemical Society.

Elprocus, "Phototransistor Basics, Circuit Diagram, Advantages & Applications", Electronics, Projects, Focus, at least as early as Jun. 12, 2020, pp. 1 through 8. www.elprocus.com/phototransistor-basics-circuit-diagram-advantages-applications/.

RF Wireless World, "Phototransistor basics, Phototransistor types, Phototransistor applications", Home of RF and Wireless Vendors and Resources, at least as early as Jun. 12, 2020, pp. 1 through 6, www.rfwireless-world.com/Articles/Phototransistor-basics-and-Phototransistor-types.html.

Agrawal et al., "Secondary Nucleation: Mechanisms and Models", Chemical Engineering Communications, 202, 2015, pp. 698-706, Taylor & Francis Group, LLC.

Bakulin et al., "Real-Time Observation of Organic Cation Reorientation in Methylammonium Lead Iodide Perovskites", The Journal Of Physical Chemistry Letters 6, 2015, pp. 3663-3669, American Chemical Society.

Bera et al., "Trapped Photons Induced Ultrahigh External Quantum Efficiency and Photoresponsivity in Hybrid Graphene/Metal-Organic Framework Broadband Wearable Photodetectors", Advanced Functional Materials, 2018, 28, 1804802, pp. 1 through 13, Advanced Science News, www.advancedsciencenews.com.

Bonaccorso et al., "Graphene photonics and optoelectronics", Nature Photonics, Sep. 2010, pp. 611 through 622, vol. 4, Macmillan Publishers Limited, www.nature.com/naturephotonics.

Brennan et al., "Existence of a Size-Dependent Stokes Shift in CsPbBr3 Perovskite Nanocrystals", ACS Energy Letters, 2, 2017, pp. 1487 through 1488, American Chemical Society.

Cervenka et al., "Graphene field effect transistor as a probe of electronic structure and charge transfer at organic molecule—graphene interfaces", Nanoscale, 7, 2015, pp. 1471 through 1478, The Royal Society of Chemistry 2015.

Chan et al., "Reducing Extrinsic Performance-Limiting Factors in Graphene Grown by Chemical Vapor Deposition", ACSNano, 2012, pp. 3224-3229, vol. 6, No. 4, www.acsnano.org.

Chen et al., "Giant five-photon absorption from multidimensional core-shell halide perovskite colloidal nanocrystals", Nature Communications 8:15198, May 12, 2017, pp. 1 through 9, www.nature.com/naturecommunications.

Cretu et al., "Migration and Localization of Metal Atoms on Strained Graphene", Physical Review Letters 105, 196102, Nov. 5, 2010, pp. 1 through 4, The American Physical Society.

Dawlaty et al., "Measurement of the optical absorption spectra of epitaxial graphene from terahertz to visible", Applied Physical Letters 93, 131905, Sep. 30, 2008, pp. 1 through 4, American Institute of Physics.

Deng et al., "Organometal Halide Perovskite Quantum Dot Light-Emitting Diodes", Advanced Functional Materials, 26, 2016, pp. 4797-4802, Material Views, www.materialsviews.com, Wiley-VCH Verlag GmbH & Co.

Eames et al., "Ionic transport in hybrid lead iodide perovskite solar cells", Nature Communications 6:7497, Jun. 24, 2015, pp. 1 through 8, Macmillan Publishers Limited, www.nature.com/naturecommunications.

El-Barbary et al., "Structure and energetics of the vacancy in graphite", Physical Review B 68, 144107, 2003, pp. 1 through 7, The American Physical Society.

Endres et al., "Valence and Conduction Band Densities of States of Metal Halide Perovskites: A Combined Experimental—Theoretical Study", The Journal of Physical Chemistry Letters, 7, Jul. 1, 2016, pp. 2272-2729, American Chemical Society Publications.

Erdemir et al., "Nucleation of Crystals from Solution: Classical and Two-Step Models", Accounts of Chemical Research, May 2009, pp. 621-629, vol. 42, No. 5, American Chemical Society.

Geim et al., "The rise of graphene", Nature Materials, Mar. 2007, pp. 183-191, vol. 6, Nature Publishing Group, www.nature.com/naturematerials.

(56) References Cited

OTHER PUBLICATIONS

Geng et al., "Effect of surface composition on electronic properties of methylammonium lead iodide perovskite", Journal of Materiomics 1, 2015, pp. 213-220, The Chinese Ceramic Society, www.cermsoc.com/en/.

George et al., "Ultrafast Optical-Pump Terahertz-Probe Spectroscopy of the Carrier Relaxation and Recombination Dynamics in Epitaxial Graphene", Nano Letters, 2008, pp. 4248 through 4251, vol. 8, No. 12, American Chemical Society.

Gong et al., "High-Detectivity Polymer Photodetectors with Spectral Response from 300 nm to 1450 nm", Science, Sep. 25, 2009, pp. 1665 through 1667, vol. 325, www.sciencemag.org.

Guo et al., "Graphene Based Materials: Enhancing Solar Energy Harvesting", Advanced Energy Materials, 1, 2011, pp. 448-452, Wiley-VCH Verlag GmbH & Co., wileyonlinelibrary.com.

Ha et al., "Metal halide perovskite nanomaterials: synthesis and applications", Chemical Science, 8, 2017, pp. 2522 through 2536, The Royal Society of Chemistry.

Hassan et al., "Structure-Tuned Lead Halide Perovskite Nanocrystals", Advanced Materials, 28, 2016, pp. 566 through 573, Materials Views, www.materialsviews.com, Wiley-VCH Verlag GmbH & Co, wileyonlinelibrary.com.

Hu et al., "High-Performance Flexible Broadband Photodetector Based on Organolead Halide Perovskite", Advanced Functional Materials, 24, 2014, pp. 7373-7380, Materials Views, www.materialsviews.com, Wiley-VCH Verlag GmbH & Co. wileyonlinelibrary.com.

Huang et al., "Electronic structure and stability of the CH3NH3PbBr3 (001) surface", Physical Review B 94, 195309, 2016, pp. 1 through 8, American Physical Society.

Hwang et al., "Nonlinear THz Conductivity Dynamics in P-Type CVD-Grown Graphene", The Journal of Physical Chemistry B, 117, 2013, 15819 through 15824, American Chemical Society.

Jellicoe et al., "Synthesis and Optical Properties of Lead-Free Cesium Tin Halide Perovskite Nanocrystals", Journal of the American Chemical Society, 138, Feb. 22, 2016, pp. 2941 through 2944, American Chemical Society.

Jensen et al., "Long carrier lifetimes in large-grain polycrystalline CdTe without CdCl2", Applied Physics Letters 108, 263903, Jun. 27, 2016, pp. 1 through 5, AIP Publishing.

Ji et al., "Vapor-Assisted Solution Approach for High-Quality Perovskite Ch3NH3PbBr3 Thin Films for High-Performance Green Light-Emitting Diode Applications", ACS Applied Materials & Interfaces 9, 2017, pp. 42893 through 42904, ACS Publications.

Konstantatos et al., "Hybrid graphene-quantum dot phototransistors with ultrahigh gain", Nature Nanotechnology, Jun. 2012, pp. 363 through 368, vol. 7, Macmillan Publishers Limited.

Kufer et al., "Hybrid 2D-0D MoS2-PbS Quantum Dot Photodetectors", Advanced Materials 27, 2015, pp. 176 through 180, Materials Views, Wiley-VCH Verlag GmbH & Co., wileyonlinelibrary.com.

Lee et al., "High-Performance Perovskite-Graphene Hybrid Photodetector", Advanced Materials 27, 2015, pp. 41-46, Materials Views, Wiley-VCH Verlag GmbH & Co., wileyonlinelibrary.com.

Leyden et al., "Methylammonium Lead Bromide Perovskite Light-Emitting Diodes by Chemical Vapor Deposition", The Journal of Physical Chemistry Letters 8, Jun. 26, 2017, pp. 3193-3198, ACS Publications, American Chemical Society.

Li et al., "Ambipolar solution-processed hybrid perovskite phototransistors", Nature Communications 6:8238, Sep. 8, 2015, pp. 1 through 8, Macmillan Publishers Limited.

Li et al., "Defect energies of graphite: Density-functional calculations", Physical Review B 72, 184109, 2005, pp. 1 through 11, The American Physical Society.

Li et al., "Ultrahigh Carrier Mobility Achieved in Photoresponsive Hybrid Perovskite Films via Coupling with Single-Walled Carbon Nanotubes", Advanced Materials 29, 1602432, 2017, pp. 1 through 8, Advanced Science News, www.advancedsciencenews.com, Wiley-VCH Verlag GmbH & Co., wileyonlinelibrary.com.

Liao et al., "Scalable Fabrication of Self-Aligned Graphene Transistors and Circuits on Glass", Nano Letters 12, 2012, pp. 2653-2657, ACS Publications, American Chemical Society.

Liu et al., "Graphene nanomesh photodetector with effective charge tunnelling from quantum dots", Nanoscale 7, 2015, pp. 1 through 9, The Royal Society of Chemistry.

Liu et al., "Graphene photodetectors with ultra-broadband and high responsivity at room temperature", Nature Nanotechnology, Apr. 2014, pp. 273 through 278, vol. 9, www.nature.com/naturenanotechnology, Macmillan Publishers Limited.

Liu et al., "Highly Sensitive and fast Graphene Nanoribbons/CsPbBr3 Quantum Dots Photoresistor with Enhanced Vertically Metal Oxide Heterostructures", Nanoscale, 2018, pp. 1 through 8, The Royal Society of Chemistry.

Ma et al., "Stone-Wales defects in graphene and other planar sp2-bonded materials", Physical Review B 80, 033407, 2009, pp. 1 through 4, The American Physical Society.

Mashiyama et al., "The Anti-Polar Structure of Ch3NH3PbBr3", Journal of Korean Physical Society, Aug. 2007, pp. 850 through 853, vol. 51, No. 2.

Morozov et al., "Giant Instrinsic Carrier Mobilities in Graphene and Its Bilayers", Physical Review Letters 100, 016602, Jan. 11, 2008, pp. 1 through 4, The American Physical Society.

Nair et al., "Fine Structure Constant Defines Visual Transparency of Graphene", Science, Jun. 6, 2008, p. 1308, vol. 320, www.sciencemag.org.

Ning et al., "Quantum-dot-in-perovskite solids", Nature, Jul. 16, 2015, pp. 324 through 341, vol. 523, Macmillan Publishers Limited.

Pan et al., "High-Responsivity Photodetectors Based on Formamidinium Lead Halide Perovskite Quantum Dot-Graphene Hybrid", Particle & Particle Systems Characterization 35, 1700304, 2018, pp. 1 through 9, Wiley-VCH Verlag GmbH & Co.

Protesescu et al., "Nanocrystals of Cesium Lead Halide Perovskites (CsPbX3, X=Cl, Br and I): Novel Optoelectronic Materials Showing Bright Emission with Wide Color Gamut", Nano Letters 15, Jan. 29, 2015, pp. 3692 through 3696, ACS Publications, American Chemical Society.

Raccichini et al., "The role of graphene for electrochemical energy storage", Nature Materials, Mar. 2015, pp. 271 through 279, vol. 14, www.nature.com/naturematerials, Macmillan Publishers Limited.

Sarker et al., "Position-dependent and millimetre-range photodetection in phototransistors with micrometre-scale graphene on SiC", Nature Nanotechnology, Jul. 2017, pp. 668 through 675, vol. 12, www.nature.com/naturenanotechnology.

Sasaki et al., "The Origin of Raman D Band: Bonding and Antibonding Orbitals in Graphene", Crystals 3, Feb. 22, 2013, pp. 120 through 140, www.mdpi.com/journal/crystals.

Schwierz, "Graphene transistors", Nature Nanotechnology, Jul. 2010, pp. 487 through 496, vol. 5, www.nature.com/naturenanotechnology, Macmillan Publishers Limited.

\* cited by examiner

IN-SITU GROWTH OF QUANTUM DOTS AND NANO-CRYSTALS FROM ONE, TWO, OR THREE DIMENSIONAL MATERIAL

CROSS-REFERENCE TO RELATED APPLICATIONS

The present application claims benefit of U.S. Patent Application Ser. No. 62/869,453 filed Jul. 1, 2019 and U.S. Patent Application Ser. No. 62/923,074 filed Oct. 18, 2019; the entire contents of the aforementioned patent applications are incorporated herein by reference as if set forth in their entirety.

U.S. GOVERNMENT LICENSE RIGHTS

This invention was made with Government support under Award No. 1351757 awarded by NSF. The Government has certain rights in the invention.

BACKGROUND

Phototransistors have been made by depositing preformed organic-inorganic halide perovskite quantum dots (PQDs) to graphene. The PQDs were deposited by spin coating a solution of PQDs on the graphene. The PQDs are formed by homogeneous nucleation.

PQDs have high absorption coefficients and high photogeneration efficiency which make them desirable for use in phototransistors. However, PQDs have a low carrier mobility which is undesirable for optoelectronic devices. Because graphene has a high carrier mobility, the structure resulting from depositing PQDs on the graphene has an increased carrier mobility than the carrier mobility of the PQDs. Further, the resulting structure retains the high absorption coefficient and high electron-hole diffusion length of the PQDs.

As a result, a device using the structure has increased photoresponsivity which is desirable, e.g., for a phototransistor. However, because the PQDs are deposited on the graphene, the resulting separation between the PQDs and graphene limits carrier mobility, and thus the photoresponsivity of the structure.

SUMMARY

A method of growing, at least one of: (a) quantum dots and (b) nano-crystals, on a surface of a material is provided. The method comprises placing a precursor on the surface; adding an antisolvent to the precursor; and growing at least one of the quantum dots and the nanocrystals on the surface.

DRAWINGS

Figure 1B:
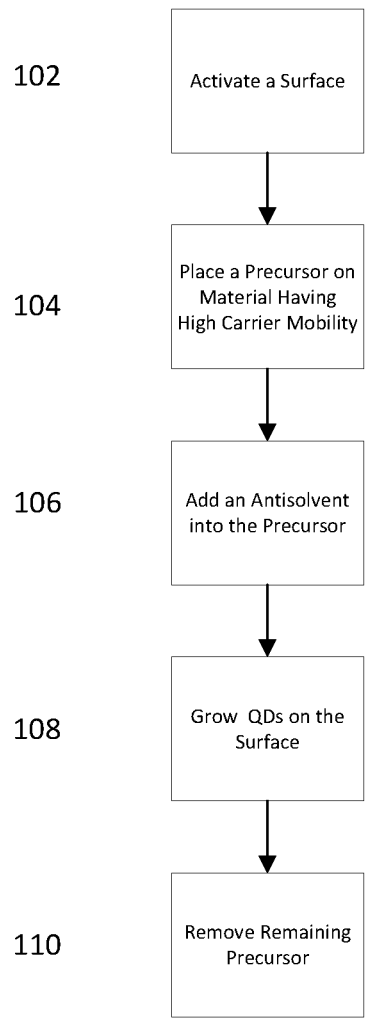

Embodiments of the present invention can be more easily understood and further advantages and uses thereof more readily apparent, when considered in view of the description of the preferred embodiments and the following figures in which:

FIG. 1A illustrates one embodiment of a structure formed by QDs grown from a material; and FIG. 1B is a flow diagram illustrating one embodiment of a method for forming a quantum dot from a material.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the invention are applicable to quantum dots (QDs) and nano-crystals. Nano-crystals have a larger diameter than quantum dots and have growth times longer than quantum dots. For pedagogical purposes embodiments of the invention will be subsequently described with reference solely to quantum dots, but is also applicable to nanocrystals.

Quantum dots may be grown, e.g., by heterogeneous nucleation, from one, two, or three dimensional material. Optionally, grown from material means grown on material. The material may have one or more properties (but not limited to) such as high carrier mobility, high carrier density ultrafast charge separation, fast charge transfer between QDs and the material, and/or better plasmonic field enhancement.

In situ growth of QDs on the material results in a structure having a least or minimum distance between the QDs and a surface of the material upon which they are grown. For example, the distance between the QDs and the material may be less than 0.5 nm; however, this distance may vary based upon materials and methods used to grow the QDs on the material. By being more closely co-located with the material, charge transfer from the QDs to such material is increased.

As a result, the structure formed by growing QDs on the material (structure) not only retains the large absorption coefficient and photogeneration efficiency of the QDs, but also provides the properties of the substrate. The properties of the structure are closer to the properties of the material from which this structure is formed. For example, electron mobility of the structure may be nearly equal to 2500 $cm^2V^{-1} s^{-1}$ if such material having high carrier mobility are two dimensional single graphene layers.

As a result, photonic devices (e.g., photodiodes and phototransistors) made with the structures formed by growing QDs on material have increased photoresponsivity than devices formed by depositing QDs to such material. For example, the structure can form all or part of a base of a bipolar junction phototransistor or of a gate of a field effect phototransistor. Photoresponsivity greater than $10^8$ $AW^{-1}$ have been measured for field effect phototransistors including PQDs grown on graphene which is about three orders of magnitude higher than the photoresponsivity of photonic devices made QDs, such as PQDs, deposited on graphene.

Material means any one, two, or three dimensional material having some unique properties, e.g., as discussed above. Materials include without limitation graphene, carbon nanotubes, and doped semiconductors (including without limitation heterojunctions). Further, the QDs may be PQDs and/or other types of QDs. Other types of QDs can be made from binary compounds such as lead sulfide, lead selenide, cadmium selenide, cadmium sulfide, cadmium telluride, indium arsenide, and indium phosphide.

The frequency response of QDs is dependent upon QD diameter; as QD diameter increases the frequencies detected by the QDs increases. In some embodiments, QD diameter may fall within a range of 2-6 nm in diameter; however, QD diameter range may differ in other embodiments. QD diameter is a function of the amount of time a QD is grown, e.g., using the exemplary methods described below.

FIG. 1A illustrates one embodiment of a structure 100A formed by QDs grown from a material. The structure comprises QDs 104 grown on the material 102. The QDs have a diameter, D, 103

An exemplary method of manufacturing QDs grown on such material will now be described. FIG. 1B is a flow diagram illustrating one embodiment of a method 100B for forming a quantum dot on from a material. The blocks of the flow diagram have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

Optionally, in block 102, activate a surface, of the material, upon which QDs are to be grown. Surface activation creates more defects in the material. By increasing the number of defects on the surface of such material, density and coverage of QDs grown on the material is increased. The defects can be created for example by dry or wet chemistry. For example, surface activation can be performed by plasma etching the surface with a plasma etcher.

In some embodiments, the material having high carrier mobility is already formed as a portion of a photonic device. For example, the material having high carrier mobility may already form a portion of a base of a bipolar phototransistor or form part of a region over a channel of a field effect phototransistor.

In block 105, place a precursor on the surface. The precursor may be deposited on the surface of the material. For example, if PQDs are to be formed, then a perovskite precursor is used. The perovskite precursor may be prepared with ligand assisted re-precipitation (LARP) by mixing stoichiometric ratios of lead bromide ($PbBr_2$) and methyl ammonium bromide ($CH_3NH_3Br$) salts in a solvent like dimethylformamide (DMF). Then, ligands of butylamine and oleic acid are added to form the perovskite precursor solution; optionally sonification may be used when adding the ligands to hasten the mixing process. Note, other precursors can be used, e.g., that do not use perovskite material or which do not use LARP; for example, lead and sulfur precursors may be deposited on the surface of the material to grow lead sulfide quantum dots.

In block 106, adding an antisolvent into the precursor. The antisolvent may be deposited into the precursor or vice versa. The antisolvent makes the precursor less soluble and forms droplets of precursor in the antisolvent. The antisolvent may be toluene, diethyl ether, chlorobenzene, chloroform, and/or another chemical that is an antisolvent.

In block 108, grow QDs on the surface. The droplets of the precursor precipitate seeding (or crystallization) of embryo(s) when a droplet is located at active and/or defect site(s) on the surface of the material having high carrier mobility. The active sites have energies which are sufficiently high to cause heterogeneous nucleation of the QDs at each active site. Defect sites are a type of an active site.

Optionally, blocks 102, 104, 106, and/or 108 may be performed at a temperature in a range between 0 C and 150 C.

A QD is formed from an embryo only if the embryo diameter (or corresponding energy) grows to exceed a critical diameter (or critical energy). Such QD growth rate and surface density can be increased by increasing the temperature of the surface of the material having high mobility; this is because the number of active sites is increased on the surface when increasing the temperature of the surface. The critical diameter, and critical energy, depends upon the type of material used to form the QDs.

In block 110, optionally, remove remaining precursor, e.g., on the surface. The remaining precursor can be removed by washing the material on which QDs are grown, e.g., with an antisolvent or a solvent. However, the precursor may be removed by other techniques.

EXEMPLARY EMBODIMENTS

Example 1 includes a method of growing, at least one of: (a) quantum dots and (b) nano-crystals, on a surface of a material, the method comprising: placing a precursor on the surface; adding an antisolvent to the precursor; and growing on the surface the at least one of quantum dots and nano-crystals.

Example 2 includes the method of Example 1, further comprising activating the surface.

Example 3 includes the method of any of Examples 1-2, further comprising removing remaining precursor.

Example 4 includes the method of any of Examples 2-3, wherein activating the surface comprises performing dry or wet etching of the surface.

Example 5 includes the method of any of Examples 1-4, wherein the at least one of: (a) quantum dots and (b) nano-crystals are separated from the surface of the material by a minimum distance.

Example 6 includes the method of Example 5, wherein the minimum distance is less than any of Examples 0-1.5 nm.

Example 7 includes the method of any of Examples 1-6, wherein the at least one of: (a) quantum dots and (b) nano-crystals consists of perovskite quantum dots; and wherein the precursor is a perovskite precursor.

Example 8 includes the method of any of Examples 1-7, wherein the material comprises graphene, carbon nanotubes, or at least one doped semiconductor.

Example 9 includes the method of any of Examples 1-8, wherein the carrier mobility of the material is higher than the carrier mobility of the at least one of: (a) quantum dots and (b) nano-crystals.

Example 10 includes the method of any of Examples 1-8, wherein the antisolvent comprises at least one of toluene, diethyl ether, chlorobenzene, and chloroform.

Example 11 includes a device, comprising: a material having a surface; at least one of (a) quantum dots and (b) nano-crystals grown on the surface of the material; and wherein the at least one of: (a) quantum dots and (b) nano-crystals are separated from the surface of the material by a minimum distance.

Example 12 includes the device of Example 11, wherein the surface has been activated creating more defects on the surface.

Example 13 includes the device of any of Examples 11-13, wherein the minimum distance is less than any of Examples 0-1.5 nm.

Example 14 includes the device of any of Examples 11-13, wherein the at least one of (a) quantum dots and (b) nano-crystals consists of perovskite quantum dots.

Example 15 includes the device of any of Examples 11-14, wherein the material comprises graphene, carbon nanotubes, or at least one doped semiconductor.

Example 16 includes the device of any of Examples 11-15, wherein the carrier mobility of the material is higher than the carrier mobility of the at least one of: (a) quantum dots and (b) nano-crystals.

Example 17 includes a device, comprising: graphene having a surface; at least one of: (a) quantum dots and (b) nano-crystals grown on the surface of the graphene; wherein the at least one of: (a) quantum dots and (b) nano-crystals are separated from the surface of the graphene by a minimum distance; wherein the carrier mobility of the graphene is higher than the carrier mobility of the at least one of: (a) quantum dots and (b) nano-crystals; and wherein the device is configured to be used in a photonic device.

Example 18 includes the device of Example 17, wherein the graphene is two dimensional single layer graphene.

Example 19 includes the device of any of Examples 17-18, wherein the minimum distance is less than any of Examples 0-1.5 nm.

Example 20 includes the device of any of Examples 17-19, wherein the at least one of (a) quantum dots and (b) nano-crystals consists of perovskite quantum dots Terms of relative position as used in this application are defined based on a plane parallel to the conventional plane or working surface of a material (e.g., a layer or a substrate), regardless of orientation. Terms such as "on," "higher," "lower," "over," "top," and "under" are defined with respect to the conventional plane or working surface being on the top surface of a layer or substrate, regardless of orientation.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of growing, at least one of: (a) quantum dots and (b) nano-crystals, on a surface of a material, the method comprising:
    placing a precursor on the surface;
    adding an antisolvent to the precursor; and
    growing, from the surface of the material, the at least one of quantum dots and nano-crystals.

2. The method of claim 1, further comprising activating the surface of the material to create additional defect sites on the surface of the material.

3. The method of claim 2, wherein activating the surface comprises performing dry or wet etching of the surface.

4. The method of claim 1, further comprising removing remaining precursor.

5. The method of claim 1, wherein the at least one of: (a) quantum dots and (b) nano-crystals are separated from the surface of the material by a minimum distance.

6. The method of claim 5, wherein the minimum distance is less than 0.5 nm.

7. The method of claim 1, wherein the at least one of: (a) quantum dots and (b) nano-crystals consists of perovskite quantum dots; and
    wherein the precursor is a perovskite precursor.

8. The method of claim 1, wherein the material comprises graphene, carbon nanotubes, or at least one doped semiconductor.

9. The method of claim 1, wherein carrier mobility of the material is higher than carrier mobility of the at least one of: (a) quantum dots and (b) nano-crystals.

10. The method of claim 1, wherein the antisolvent comprises at least one of toluene, diethyl ether, chlorobenzene, and chloroform.

11. The method of claim 1, wherein the at least one quantum dot and/or nano-crystal is grown from a defect site on the surface of the material.

* * * * *